(12) United States Patent
Standing

(10) Patent No.: US 6,967,412 B2
(45) Date of Patent: Nov. 22, 2005

(54) WAFER LEVEL UNDERFILL AND INTERCONNECT PROCESS

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 21 days.

(21) Appl. No.: 10/421,971

(22) Filed: Apr. 22, 2003

(65) Prior Publication Data

US 2003/0207490 A1 Nov. 6, 2003

Related U.S. Application Data

(62) Division of application No. 10/225,399, filed on Aug. 20, 2002, now Pat. No. 6,582,990.
(60) Provisional application No. 60/314,818, filed on Aug. 24, 2001.

(51) Int. Cl.⁷ .............................................. H01L 23/28
(52) U.S. Cl. .................. 257/787; 257/788; 257/789; 257/793; 257/795
(58) Field of Search ................ 257/787, 788, 257/789, 793, 795

(56) References Cited

U.S. PATENT DOCUMENTS

| | | |
|---|---|---|
| 3,494,023 A | 2/1970 | Dorendorf |
| 3,561,107 A | 2/1971 | Best et al. |
| 3,871,014 A | 3/1975 | King et al. |
| 3,972,062 A | 7/1976 | Hopp |
| 4,021,838 A | 5/1977 | Warwick |
| 4,604,644 A | 8/1986 | Beckham et al. |
| 5,019,944 A | 5/1991 | Ishii et al. |
| 5,136,365 A | 8/1992 | Pennisi et al. |
| 5,173,369 A | 12/1992 | Kataoka |
| 5,217,922 A | 6/1993 | Akasaki et al. |
| 5,311,402 A | 5/1994 | Kobayashi et al. |
| 5,313,366 A | 5/1994 | Gaudenzi et al. |
| 5,367,435 A | 11/1994 | Andros et al. |
| 5,371,404 A | 12/1994 | Juskey et al. |
| 5,381,039 A | 1/1995 | Morrison |
| 5,394,490 A | 2/1995 | Kato et al. |
| 5,397,921 A | 3/1995 | Karnezos |
| 5,447,886 A | 9/1995 | Rai |
| 5,448,114 A | 9/1995 | Kondoh et al. |
| 5,450,283 A * | 9/1995 | Lin et al. .................... 361/704 |
| 5,454,160 A | 10/1995 | Nickel |
| 5,458,694 A | 10/1995 | Nuyen |
| 5,474,620 A | 12/1995 | Nath et al. |
| 5,477,087 A | 12/1995 | Kawakita et al. |
| 5,484,648 A | 1/1996 | Odashima et al. |
| 5,492,863 A * | 2/1996 | Higgins, III ................ 438/610 |
| 5,510,758 A | 4/1996 | Fujita et al. |

(Continued)

FOREIGN PATENT DOCUMENTS

| | | | |
|---|---|---|---|
| JP | 5-129516 | 5/1993 | |
| JP | 7-94554 | * 4/1995 | ........... H01L/21/60 |

OTHER PUBLICATIONS

MOSFET BGA Design Guide 2004–Fairchild Semiconductor, pp. i–ii and pp. 1–43.

Primary Examiner—Jasmine Clark
(74) Attorney, Agent, or Firm—Ostrolenk, Faber, Gerb & Soffen, LLP

(57) ABSTRACT

A chip scale package and a method for its manufacture which include providing sticky interconnects on a surface of a semiconductor die, the interconnects being surrounded by a layer of thermal epoxy.

17 Claims, 5 Drawing Sheets

U.S. PATENT DOCUMENTS

| | | |
|---|---|---|
| 5,512,786 A | 4/1996 | Imamura et al. |
| 5,532,512 A | 7/1996 | Fillion et al. |
| 5,554,887 A | 9/1996 | Sawai et al. |
| 5,559,444 A | 9/1996 | Farnworth et al. |
| 5,578,869 A | 11/1996 | Hoffman et al. |
| 5,604,445 A | 2/1997 | Desai et al. |
| 5,634,267 A | 6/1997 | Farnworth et al. |
| 5,654,590 A | 8/1997 | Kuramochi |
| 5,661,042 A | 8/1997 | Fang et al. |
| 5,668,059 A | 9/1997 | Christie et al. |
| 5,674,780 A | 10/1997 | Lytle et al. |
| 5,703,405 A | 12/1997 | Zeber |
| 5,709,336 A | 1/1998 | Ingraham et al. |
| 5,726,489 A | 3/1998 | Matsuda et al. |
| 5,726,501 A | 3/1998 | Matsubara |
| 5,726,502 A | 3/1998 | Beddingfield |
| 5,729,440 A | 3/1998 | Jimarez et al. |
| 5,734,201 A | 3/1998 | Djennas et al. |
| 5,739,585 A | 4/1998 | Akram et al. |
| 5,789,278 A | 8/1998 | Akram et al. |
| 5,813,870 A | 9/1998 | Gaynes et al. |
| 5,814,401 A | 9/1998 | Gamota et al. |
| 5,814,894 A | 9/1998 | Igarashi et al. |
| 5,847,022 A | 12/1998 | Yamashina et al. |
| 5,861,678 A | 1/1999 | Schrock |
| 5,910,641 A | 6/1999 | Gaynes et al. |
| 5,925,930 A * | 7/1999 | Farnworth et al. .......... 257/737 |
| 5,931,371 A | 8/1999 | Pao et al. |
| 5,931,685 A | 8/1999 | Hembree et al. |
| 5,940,729 A | 8/1999 | Downes, Jr. et al. |
| 5,977,642 A | 11/1999 | Appelt et al. |
| 5,990,566 A | 11/1999 | Farnworth et al. |
| 6,002,180 A | 12/1999 | Akram et al. |
| 6,016,060 A | 1/2000 | Akram et al. |
| 6,040,702 A | 3/2000 | Hembree et al. |
| 6,077,723 A | 6/2000 | Farnworth et al. |
| 6,097,087 A | 8/2000 | Farnworth et al. |
| 6,107,122 A | 8/2000 | Wood et al. |
| 6,133,634 A | 10/2000 | Joshi |
| 6,150,726 A | 11/2000 | Feilchenfeld et al. |
| 6,194,788 B1 | 2/2001 | Gilleo et al. |
| 6,259,036 B1 | 7/2001 | Farnworth |
| 6,391,687 B1 | 5/2002 | Cabahug et al. |
| 6,744,124 B1 | 6/2004 | Chang et al. |
| 2001/0050441 A1 * | 12/2001 | Shivkumar et al. .......... 257/77 |

* cited by examiner

WAFER LEVEL UNDERFILL AND INTERCONNECT PROCESS

RELATED APPLICATIONS

This application is a divisional of U.S. application Ser. No. 10/225,399, filed Aug. 20, 2002 U.S. Pat. No. 6,582,990 entitled WAFER LEVEL UNDERFILL AND INTERCONNECT PROCESS which is based on and claims priority to U.S. Provisional Application No. 60/314,818 entitled WAFER LEVEL UNDERFILL AND INTERCONNECT PROCESS, filed on Aug. 24, 2001, the subject matter and disclosure of which is incorporated by reference.

FIELD OF THE INVENTION

This application relates to a semiconductor device and more particularly to a chip-scale semiconductor device and a method for manufacturing thereof.

BACKGROUND OF THE INVENTION

Semiconductor devices such as power switches are a common part of electronic devices. Such devices are often packaged so that they may be practically incorporated into an electronic circuit. Due to the desire for smaller electronic devices there is a demand for electronic packages of smaller size. Chip scale packages thus have been developed which are the size of or nearly the size of a semiconductor device.

Also known are semiconductor device packages in which all electrodes are located on a common die surface and are connectable to corresponding conductive pads or traces on a support surface such as a printed circuit board.

The proper placement and attachment of a semiconductor package to a circuit board is an important step in manufacturing of electronic circuits. At the present time, such devices are first soldered down to the board and in a separate step a liquid epoxy is applied around the periphery of the device which is pulled into the space between the device bottom and the top of the board by capillary action to form an underfill to improve device temperature cycling capability. Often, such a process requires the device to be first soldered in an automated step before the underfill material is applied. Thus, if during the soldering process the device is placed less than perfectly there is a chance that the underfill material will not be deposited accurately and may unintentionally spill over to the other areas of the board. This of course is undesirable and may require the circuit board to be designed in such a way to accommodate spillage due to misplacement of the semiconductor package. For example, the area on the circuit board intended for the semiconductor package may be enlarged to accommodate the spillage of the underfill material. This solution of course requires the enlargement of the circuit board which is contrary to the desire for a smaller electronic device.

It would be desirable to provide a semiconductor package which can be accurately placed on a circuit board and attached thereto without the drawbacks of the conventionally known devices discussed above.

BRIEF DESCRIPTION OF THE INVENTION

A semiconductor device according to the present invention is prepared to include the materials needed for board attach and underfill so that the user need only provide a thermal excursion to complete the attach process thus avoiding the problems encountered by prior art packages and attach methods.

In accordance with the invention a novel attach system, which can be made at wafer level, employs a silver loaded epoxy for the interconnects and a thermal epoxy which is disposed between the silver loaded interconnects for an underfill.

The preferred embodiment of the invention is a flip chip type semiconductor device which is processed at wafer level before singulation.

Specifically, a wafer having a plurality of identical die is first coated with a suitable photo-sensitive epoxy passivation layer. This layer is then processed to open windows over contacts of each one of the die. Then interconnects will be disposed on and connected to each contact of each die through a respective window.

According to an aspect of the present invention the interconnects are composed of a silver loaded epoxy having certain advantageous characteristics. Specifically, the silver loaded epoxy has a resin as a matrix material that is semi-solid and will be sticky to the touch at room temperature. The silver loaded epoxy may also include fillers which give the interconnects structural integrity both at room temperature and at higher temperatures.

To allow the silver loaded epoxy to be deposited on the contents of respective die it can be reduced using solvents. These solvents, when evaporated, leave the interconnects with a sticky exterior surface.

Next, a thermal epoxy is laid down across the surface of the wafer. The thermal epoxy, which will constitute the underfill layer, is solid at room temperature (staying solid to a slightly higher temperature than that used for the interconnects) and is reduced with a solvent. The thermal epoxy layer may be formed through a process of repeated deposition and evaporation to a thickness of slightly less than the height of the interconnects.

Once the thermal epoxy layer is formed the die are singulated by, for example, sawing thus forming a plurality of chip-scale semiconductor devices.

To achieve the intended purposes of the present invention, according to one aspect of the present invention, during a solder reflowing process such as that commonly used for SMT (surface mount) assembly, a semiconductor device according to the present invention is first subjected to a reflow process and then the thermal epoxy is cured to form the underfill structure. Specifically, when the device is first placed on the board the sticky interconnects of the device serve to keep the device in a proper place on the circuit board. As the temperature is elevated the interconnect resin starts to become mobile, but the fillers will prevent these interconnects from slumping at this stage. As the temperature increases still further, the thermal epoxy becomes mobile, and, having no structuring fillers, will become less viscous. Thus, the thermal epoxy flows readily and by capillary action is pulled toward the center of the semiconductor device.

In a preferred embodiment of the invention, once the temperature exceeds about 110° C. the epoxy starts to cure. If necessary, however, this cure temperature can be increased. The epoxy resin and the hardener system of the thermal epoxy used in a semiconductor device according to the present invention are selected to be capable of fully curing within the solder reflow cycle.

DETAILED DESCRIPTION OF THE DRAWINGS

Figure 1:
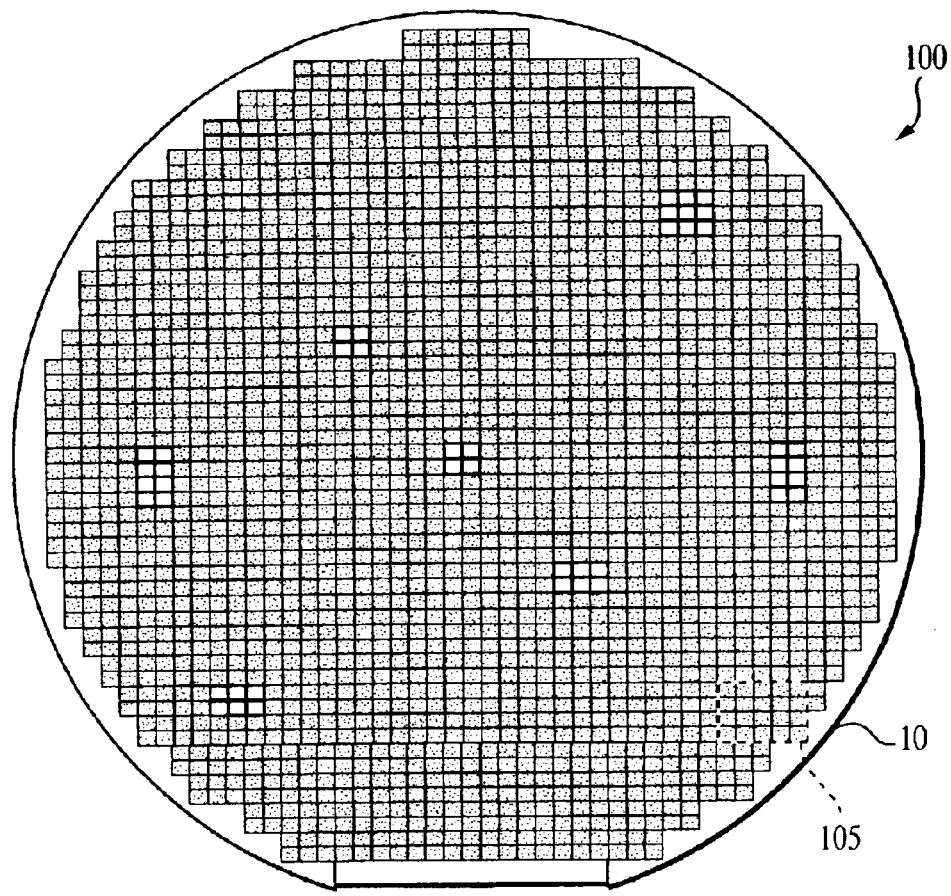
FIG. 1 shows a top plan view of a semiconductor wafer having a plurality of identical semiconductor die formed on a top surface thereof.

FIG. 1 shows a wafer 100 of monolithic silicon which includes a plurality of identical die 10 formed therein. The die 10 formed in wafer 100 may be power switching devices such as MOSFETs or IGBTs or power diodes.

Figure 2:
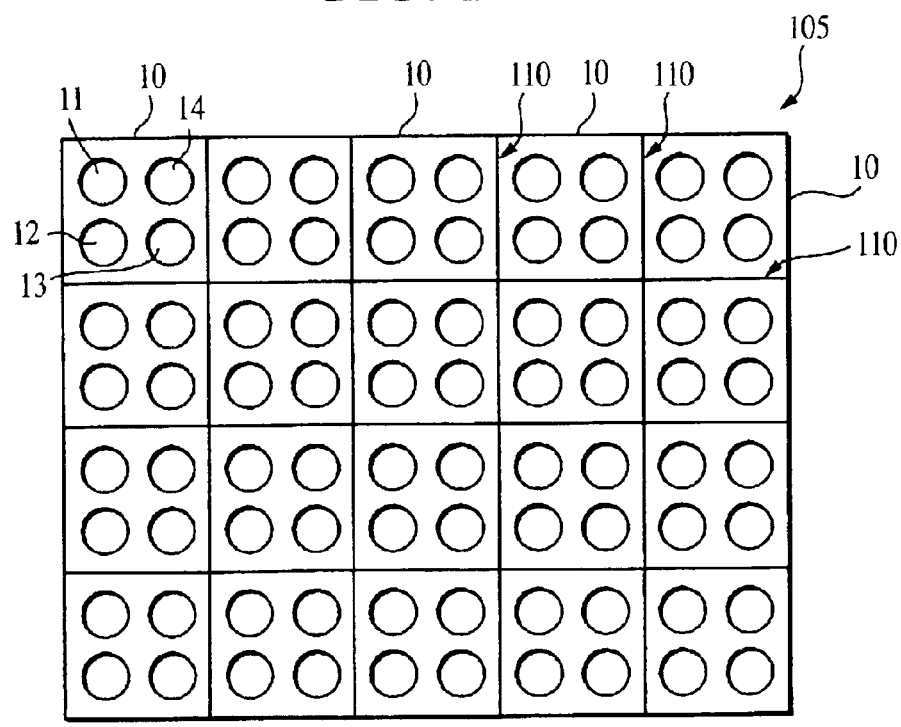
FIG. 2 shows a top plan view of a representative portion of the wafer shown by FIG. 1.

FIG. 2 shows a representative portion 105 of wafer 100 which includes a plurality of adjacently disposed die 10. Each die 10 is isolated from its neighboring die 10 by intersecting streets 110. According to the preferred embodiment, die 10 is a MOSFET that includes all its major electrical contacts 11, 12, 13, 14 on only one of its major surfaces. Specifically, each die 10 includes on only one major surface thereof source contacts 11, 12, drain contact 13 and gate contact 14. Other varieties of die may also be processed into a semiconductor device according to the present invention.

Figure 3:
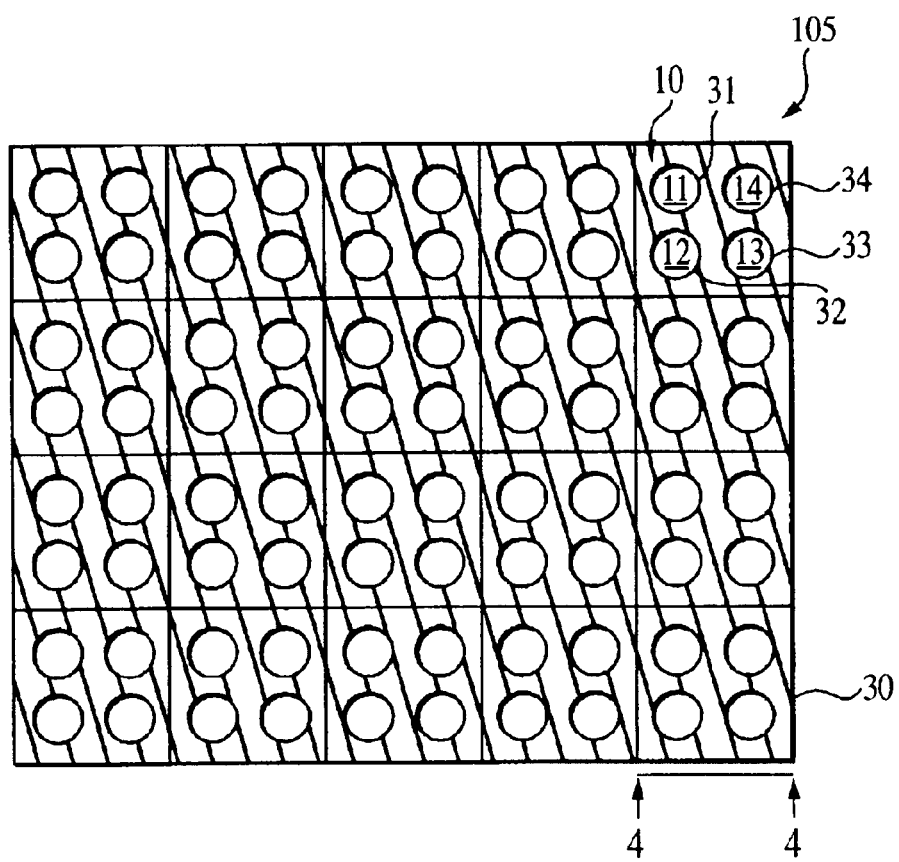
FIG. 3 shows the representative portion of the wafer as shown by FIG. 2 having a passivation layer with windows over the electrical contacts of the die in the wafer.
Figure 4:
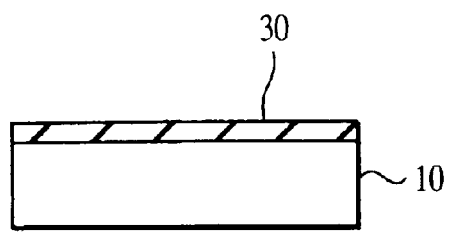
FIG. 4 shows part of the portion shown in FIG. 3 as viewed looking in the direction of and between arrows 4—4.

Referring next to FIGS. 3 and 4, a passivation layer 30 is deposited over the entire surface of wafer 100, a representative portion 105 of which is shown by FIG. 3. Passivation layer 30 is composed of photosensitive epoxy.

Next, using a photolithographic method, which may include an imaging step followed by a curing step, passivation layer 30 is processed to provide windows 31, 32, 33, 34 over source contacts 11, 12, drain contact 13 and gate contact 14 respectively of each die. Each window 31, 32, 33, 34 extends from the top of passivation layer 30 to the top surface of a respective contact thereby exposing it.

Figure 5:
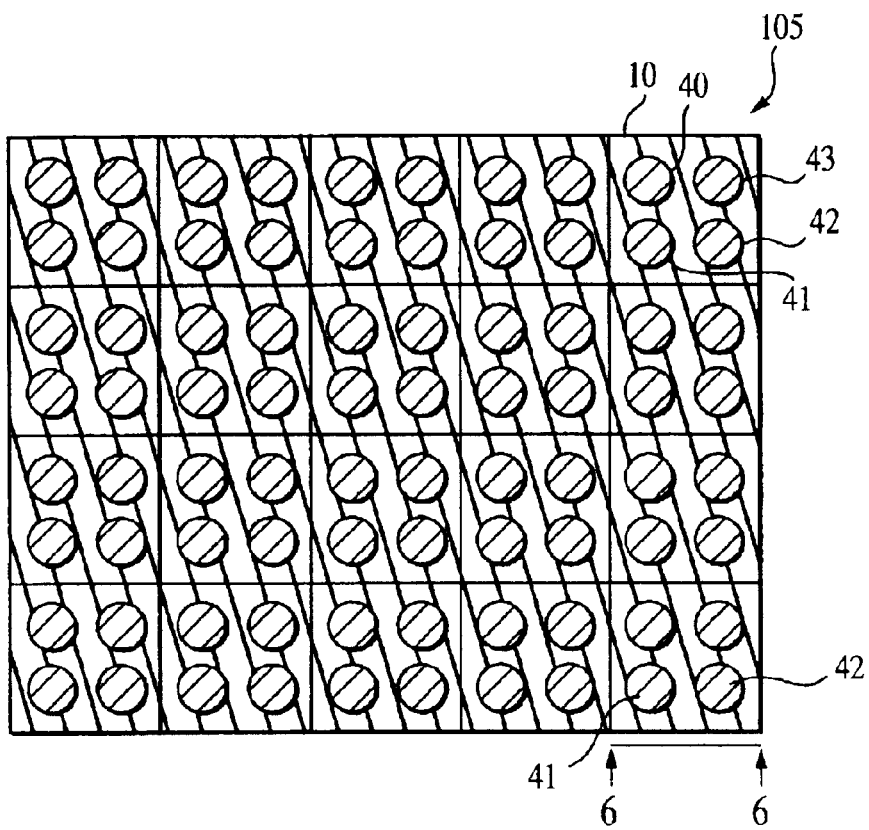
FIG. 5 shows the representative portion of the wafer as shown by FIG. 3 having silver loaded epoxy interconnects formed in its windows.
Figure 6:
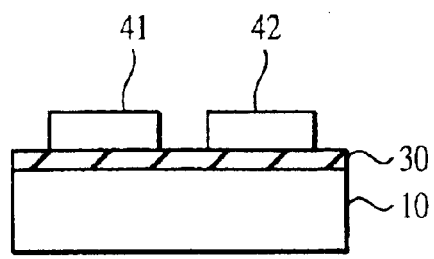
FIG. 6 shows part of the portion shown in FIG. 5 as viewed looking in the direction of and between arrows 5—5.

Referring next to FIGS. 5 and 6, silver loaded epoxy is deposited inside windows 31, 32, 33, 34 of each die to form interconnects 40, 41, 42, 43 therein which are electrically connected respectively to electrical contacts 11, 12, 13, 14 of each die 10. The silver loaded epoxy can be deposited in any desired way, such as by screening or by dispensing. The silver loaded epoxy according to the preferred embodiment includes 60% to 85% silver by weight of silver particles of 3 to 40 microns in size. Also, in the preferred embodiment, the silver epoxy used in the interconnects 40, 41, 42, 43 will contain a suitable solvent such as Dowanol PMA (propylene glycol) or a similar chemical. The selection of the solvent will depend on its speed and volatility. That is, there will be a balance between being slow enough to process the material and yet fast enough to result in a shorter drying time. Also, it should be noted that the solvent content will determine the shrinkage experienced by the interconnects 40, 41, 42, 43. Further, the evaporation temperature of the solvent in the preferred embodiment is kept well below the curing temperature of the epoxy. Preferably, the solvent speed is about one hour. Significantly, when the solvent has evaporated, and the epoxy is still uncured, the surfaces of the interconnects 40, 41, 42, 43 will be slightly sticky.

In the preferred embodiment, the silver loaded epoxy will contain a suitable amount of filler material such as micronized glass, mica or barium sulphate in addition to the silver particles. The filler material will prevent the epoxy that forms the interconnects 40, 41, 42, 43 from slumping when the epoxy is semiliquid such as when the interconnects are heated.

Figure 7:
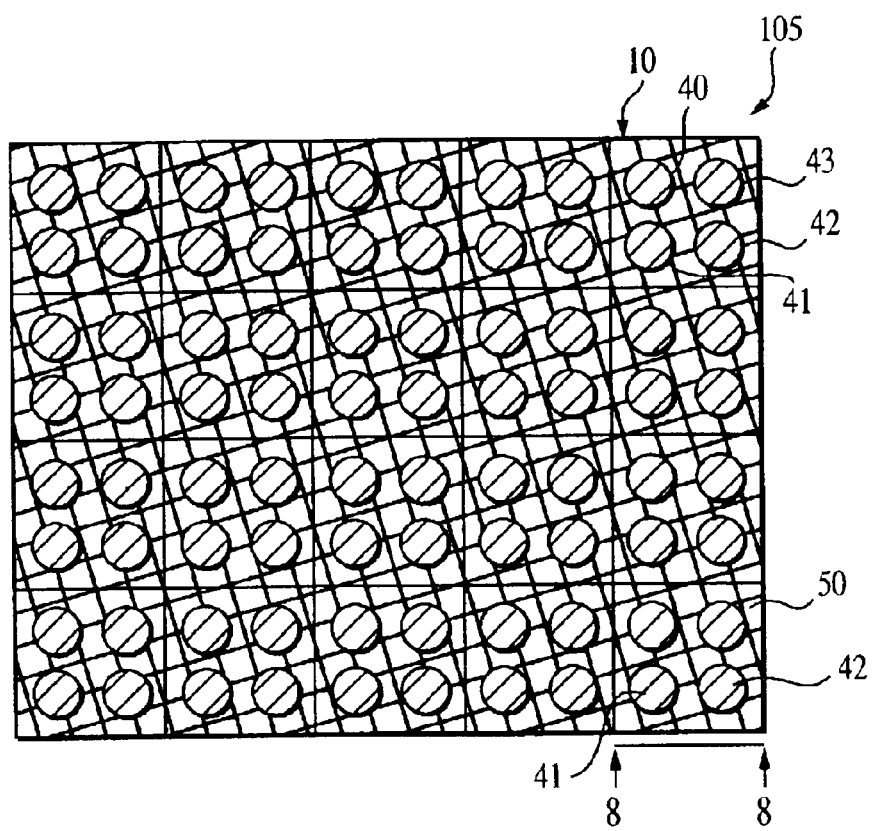
FIG. 7 shows the representative portion of the wafer as shown by FIG. 5 having a thermal epoxy layer deposited around the interconnects of each die.
Figure 8:
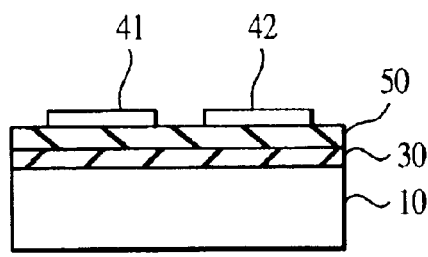
FIG. 8 shows part of the portion shown in FIG. 7 as viewed looking in the direction of and between arrows 8—8.

Referring next to FIGS. 7 and 8, a thermal epoxy layer 50 is deposited over the top surface of wafer 100, a representative portion 105 of which is shown by FIG. 7. The solvent in the thermal epoxy 50 is then evaporated leaving an uncured solid thermal epoxy layer 50. The thermal epoxy layer 50 when dried, surrounds the interconnects 40, 41, 42, 43 of each die 10, and extends to a height below that of interconnects 40, 41, 42, 43 as shown schematically by FIG. 8. The thermal epoxy 50 layer may be deposited in one step followed by a drying step or by multiple deposition steps each followed by a drying step. Epoxies that may be used in the conductive interconnects and the thermal epoxy include epoxy novalac or mixes of bisphenyl A and bisphenyl F.

Wafer 100 is then singulated into individual semiconductor devices by, for example, sawing along streets 110. A semiconductor device so manufactured may be then packaged as in a tape and reel and shipped to the user, with interconnects 40, 41, 42, 43 of each device being formed of sticky and uncured silver loaded epoxy, and each including a layer of dry and uncured thermal epoxy 50 surrounding its interconnects 40, 41, 42, 43.

Figure 9:
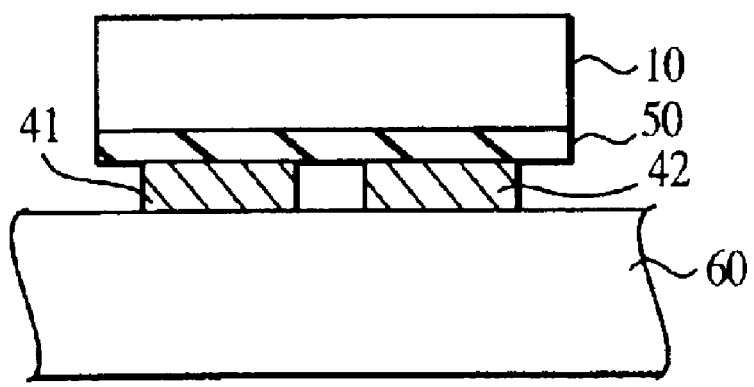
FIG. 9 is a side view of a semiconductor device according to the present invention disposed over a circuit board prior to heating.
Figure 10:
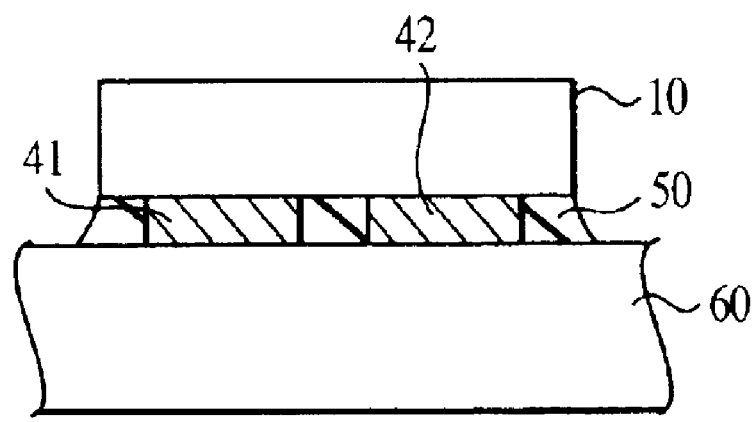
FIG. 10 shows a side view of a semiconductor device according to the present invention as connected to a circuit board after the appropriate heating step.

Referring to FIGS. 9 and 10, the sticky or adhesive surfaces of interconnects 40, 41, 42, 43 hold the die in place on a board 60. Thereafter, the board (which may also be loaded with other components to be soldered down) is reflowed, using a traditional solder reflow process.

The interconnects 40, 41, 42, 43 become slightly softer at approximately 80° C. and allow a connection to form with conductive pads (not shown) on board 60. At the same time the thermal epoxy 50 layer becomes fairly fluid (to the consistency of thick oil) and flows to form a connection between the die 10 and the top surface of board 60. The viscosity of the thermal epoxy 50 continues to reduce until the temperature exceeds about 150° C. At this point the catalyst in the external epoxy 50 starts a cure reaction. The catalyst is controlled by the use of known cure initiators and retardants to stop lower temperature curing. When the board 60 emerges from the end of the reflow oven, the epoxy system is cured and the device has silver interconnects connected to the conductive pads of the board 60. The thermal epoxy 50 has flown out forming a bond between the die 10 surface and the board 60 everywhere except where the interconnections 40, 41, 42, 43 are (underfilled) as best shown in FIG. 10.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor device, comprising:

a semiconductor die having a major surface;

an electrical contact on said major surface of said semiconductor die;

an interconnect on said electrical contact, said interconnect being composed of a sticky epoxy containing conductive particles; and a layer of thermal epoxy disposed on said major surface and surrounding said interconnect.

2. A semiconductor device according to claim 1, wherein said layer of thermal epoxy has a maximum height below that of said interconnect.

3. A semiconductor device according to claim 1, wherein said conductive particles comprise of silver.

4. A semiconductor device according to claim 1, wherein said conductive epoxy comprises of 60% to 85% silver particles by weight, said particles being 3 to 40 microns.

5. A semiconductor device according to claim 1, wherein all major electrical contacts of said die are disposed on said major surface, and wherein interconnects are formed on all major electrical contacts of said die.

6. A semiconductor device according to claim 5, wherein said die is one of MOSFET, IGBT and diode.

7. A semiconductor device according to claim 1, wherein said die is one of MOSFET, IGBT and diode.

8. A semiconductor device, comprising:

a semiconductor die having a major surface;

an electrical contact on said major surface of said semiconductor die;

an electrical interconnect comprised of an epoxy containing conductive particle and disposed on said electrical contact; and a layer of underfilling material disposed on said electrical contact around said electrical interconnect, said underfilling material being comprised of an uncured curable material.

9. A semiconductor device according to claim 8, wherein said underfilling material is a thermal epoxy.

10. A semiconductor device according to claim 8, wherein said particles are 3 to 40 microns.

11. A semiconductor device according to claim 8, wherein said conductive particles are comprised of silver.

12. A semiconductor device according to claim 8, wherein all major electrical contacts of said die are disposed on said major surface, and wherein interconnects are formed on all major electrical contacts of said die.

13. A semiconductor device according to claim 8, wherein said die is one of MOSFET, IGBT and diode.

14. A semiconductor device comprising:

a semiconductor die having at least one major electrode disposed on a major surface thereof;

an electrical connector formed on said major electrode, said electrical connector being adapted for electrical connection to a conductive pad; and an underfilling body disposed on said one major electrode, said underfilling body being adapted to become disposed between said electrode and a circuit board when said device is mounted on said circuit board wherein said major electrode is a power electrode of said semiconductor die.

15. A semiconductor device according to claim 14, wherein said underfilling body is comprised of a curable epoxy.

16. A semiconductor device according to claim 15, wherein said epoxy is thermally curable.

17. A semiconductor device according to claim 14, wherein said semiconductor die is a power MOSFET.

* * * * *